(12) United States Patent
Hammel et al.

(10) Patent No.: US 8,559,475 B2
(45) Date of Patent: Oct. 15, 2013

(54) HEAT SINK AND ASSEMBLY OR MODULE UNIT

(75) Inventors: Ernst Hammel, Vienna (AT); Jürgen Schulz-Harder, Lauf a.d. Pegnitz (DE)

(73) Assignee: Curamik Electronics GmbH, Eschenbach (DE)

(*) Notice: Subject to any disclaimer, the term of this patent is extended or adjusted under 35 U.S.C. 154(b) by 509 days.

(21) Appl. No.: 12/450,505

(22) PCT Filed: Dec. 4, 2007

(86) PCT No.: PCT/DE2007/002186
§ 371 (c)(1),
(2), (4) Date: Mar. 22, 2010

(87) PCT Pub. No.: WO2008/119309
PCT Pub. Date: Oct. 9, 2008

(65) Prior Publication Data
US 2010/0290490 A1 Nov. 18, 2010

(30) Foreign Application Priority Data

Mar. 30, 2007 (DE) .......................... 10 2007 015 771
Jun. 14, 2007 (DE) .......................... 10 2007 027 991
Jun. 29, 2007 (DE) .......................... 10 2007 030 389

(51) Int. Cl.
*H01S 3/04* (2006.01)
(52) U.S. Cl.
USPC .................. 372/36; 372/34; 372/35; 361/709; 361/711

(58) Field of Classification Search
USPC ................................ 372/34–36; 361/709, 711
See application file for complete search history.

(56) References Cited

U.S. PATENT DOCUMENTS

| | | | |
|---|---|---|---|
| 3,744,120 A | 7/1973 | Burgess et al. | |
| 4,757,934 A | 7/1988 | Greenstein | |
| 2004/0131835 A1 | 7/2004 | Schmitt et al. | |
| 2004/0265489 A1 | 12/2004 | Dubin | |
| 2005/0087735 A1 | 4/2005 | Behringer et al. | |
| 2006/0045153 A1 | 3/2006 | Carter et al. | |
| 2006/0103005 A1* | 5/2006 | Schulz-Harder et al. | 257/703 |

FOREIGN PATENT DOCUMENTS

| | | |
|---|---|---|
| DE | 2213115 | 9/1973 |
| DE | 2319854 | 10/1973 |
| DE | 203 02 430 | 5/2003 |
| DE | 102004055534 | 5/2006 |
| EP | 0009978 | 4/1980 |
| EP | 153618 | 9/1985 |
| EP | 1 420 446 | 5/2004 |
| JP | 2004200571 | 7/2004 |

* cited by examiner

Primary Examiner — Yuanda Zhang
(74) Attorney, Agent, or Firm — Welsh Flaxman & Gitler LLC

(57) ABSTRACT

A heat sink for cooling parts, subassemblies, modules, or similar components, for cooling electrical or electronic components. The heat sink includes at least one cooling element which forms at least one cooling area for connecting the component that is to be cooled and which is made of a metallic material in the cooling area.

29 Claims, 6 Drawing Sheets

HEAT SINK AND ASSEMBLY OR MODULE UNIT

BACKGROUND OF THE INVENTION

The invention relates to a heat sink and to an assembly or module unit or arrangement.

It is generally a standard and necessary practice to cool electrical or electronic components or assemblies, in particular power components or assemblies or modules to dissipate heat loss, namely by means of at least one heat sink (cooler) comprising at least one cooling element. For this purpose, the existing art uses in particular heat sinks with cooling elements in which at least one, preferably highly branched cooling channel structure is provided, through which a liquid and/or gaseous and/or vaporous heat-transporting or medium or cooling medium, for example water, can flow.

For optimal cooling, it is advantageous in many cases to connect such components or assemblies by means of a solder bond to an outer cooling surface of the cooling element of the heat sink. The cooling element in this case, at least in the area of its outer cooling surface, is made of a metal material with high thermal conductivity, in particular, a copper or aluminum. The solder bond between the component or assembly and the cooling element features the advantage, for example, that both components can be manufactured separately and connected with each other after being manufactured.

Problematic, however, is the fact that the solder bond or solder layer between the respective cooling element and the part of the constructional or modular unit comprising the at least one electric component, due to the generally widely differing thermal expansion coefficients of the components connected with each other by the solder layer, is subjected to considerable mechanical stress caused by thermal factors. This is especially pronounced in case of frequent changes in temperature, such as in the case of a constant load variation in the electrical component or electrical assembly, as is the case with electric drive controls, for example. This thermally related mechanical stress causes premature aging of the solder bond and in extreme cases even partial or total separation of the solder bond and therefore loss of the required cooling of the component or assembly.

The "DCB process" (direct copper bond technology) is known in the art, for example for connecting metal layers or sheets (e.g. copper sheets or foils) with each other and/or with ceramic or ceramic layers, namely using metal or copper sheets or metal or copper foils, the surfaces of which are provided with a layer or coating (melt-on layer) resulting from a chemical bond between the metal and a reactive gas, preferably oxygen. In this method, which is described for example in U.S. Pat. No. 3,744,120 and in DE-PS 23 19 854, this layer or coating (hot-melt layer) forms a eutectic with a melting temperature below the melting temperature of the metal (e.g. copper), so that the layers can be bonded to each other by placing the foil on the ceramic and heating all layers, namely by melting the metal or copper essentially only in the area of the hot-melt layer or oxide layer.

This DCB method then comprises the following steps:
oxidation of a copper foil so as to produce an even copper oxide layer;
placing of the copper foil on the ceramic layer;
heating the composite to a process temperature between approx. 1025 and 1083° C., e.g. to approx. 1071° C.;
cooling to room temperature.

Also known is the so-called active soldering method (DE 22 13 115; EP-A-153 618) for bonding metal layers or metal foils forming metallizations, in particular also of copper layers or copper foils, with ceramic material. In this process, which is used especially for manufacturing a metal-ceramic substrate, a bond is produced at a temperature of 800-1000° C. between a metal foil, for example copper foil, and a ceramic substrate, for example aluminum-nitride ceramic, using a hard solder, which in addition to a main component such as copper, silver and/or gold also contains an active metal. This active metal, which is at least one element of the group Hf, Ti, Zr, Nb, Ce, creates a bond between the solder and the ceramic through a chemical reaction, while the bond between the solder and the metal is a metallic hard solder bond.

It is an object of the invention is to present a heat sink that eliminates the above disadvantages.

SUMMARY OF THE INVENTION

The compensating layer which is provided on the at least one cooling surface of the cooling element and which is applied directly to the metal of the cooling element achieves or provides for effective compensation of the differing thermal expansion coefficients between the cooling element and the functional elements or components of an assembly or module connected with it by means of the solder bond, in particular between the metal cooling element and a metal-ceramic substrate connected with the former by means of the solder bond, or another substrate or intermediate carrier made of a material differing from that of the cooling element, for example a material or metal that is softer than the cooling element or has a reduced thermal expansion coefficient as compared with the cooling element.

Further embodiments, advantages and applications of the invention are disclosed in the following description of exemplary embodiments and the drawings. All characteristics described and/or pictorially represented, alone or in any combination, are subject matter of the invention, regardless of their being summarized or referenced in the claims.

BRIEF DESCRIPTION OF THE DRAWINGS

The invention is described below in detail based on exemplary embodiments with reference to the drawings, in which.

DETAILED DESCRIPTION OF THE INVENTION

Figure 1:
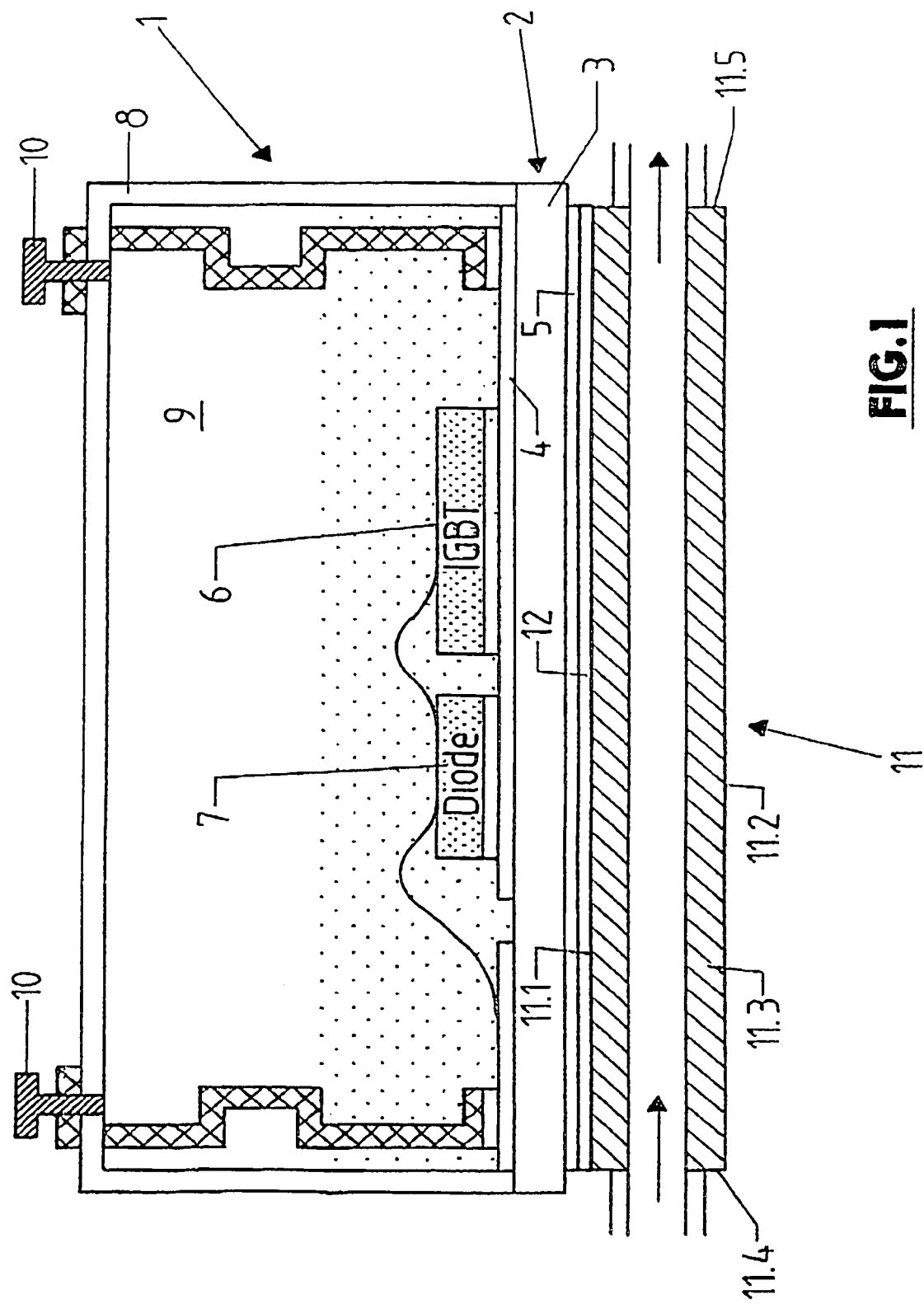
FIG. 1 is a schematic representation of an electronic power module provided on a cooling element of a heat sink.

In FIG. 1, an electric or electronic power module 1, made up of a ceramic-metal substrate 2, namely of a DCB substrate made of a ceramic layer 3, is provided on both sides with a metallization 4 or 5. The metallizations 4 and 5 are formed respectively by copper foils, which are applied full-surface to the respective top surface side of the ceramic layer 3 by means of DCB technology. The ceramic layer 3 is for example made of an aluminum oxide ($Al_2O_3$) ceramic or an aluminum nitride (AlN) ceramic. The thickness of the ceramic layer 3 is for example between 0.2 and 2 mm.

The metallization 4 of the top side of the ceramic layer 3 is structured for forming conductors, contact surfaces, etc. Electronic components are attached to the metallization 4, namely for example a power component 6, e.g. in the form of an electronic switch element (IGBT) and further controlling components 7. The components 6 and 7 are housed in a closed housing 8, which is made of plastic, for example. The interior 9 of the housing 8 is compound-filled with a suitable material. Corresponding connectors 10 lead through the top side of the housing 8 for the power supply and control of the module 1.

For cooling of the module 1, said module is provided on a cooling element 11 in FIG. 1, which functions as a heat sink for dissipating heat loss generated by the module 1 and with which the metallization 5 is bonded in an effective manner to ensure good heat transfer, namely by means of a solder layer 12. The cooling element 11 is plate-shaped or cube-shaped, namely with a top side 11.1, a bottom side 11.2, with two longitudinal sides 11.3 and with face sides 11.4 and 11.5, which together with the longitudinal sides 11.3 form the peripheral surface of the cooling element 11.

Figure 2:
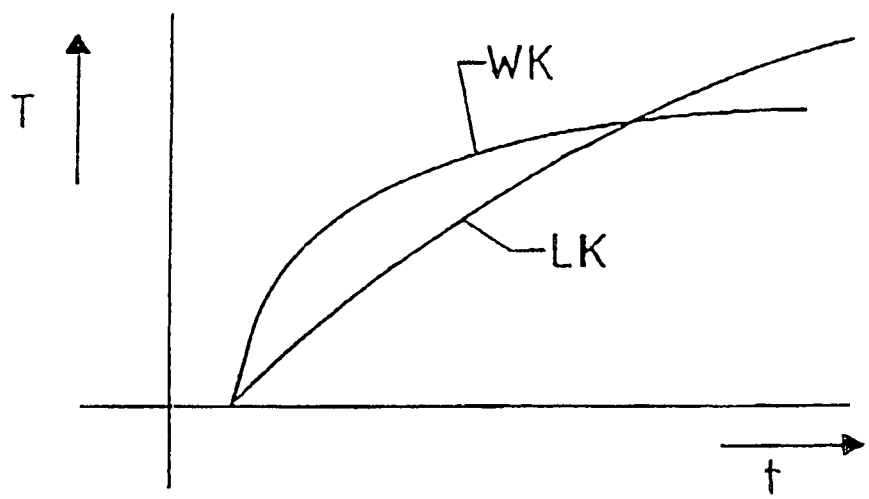
FIGS. 2 and 3 show the temperature curve of the power module based on the time at switching on or activation of the module (FIG. 2) and switching off or deactivation of the module (FIG. 3), namely using different cooling methods.
Figure 3:
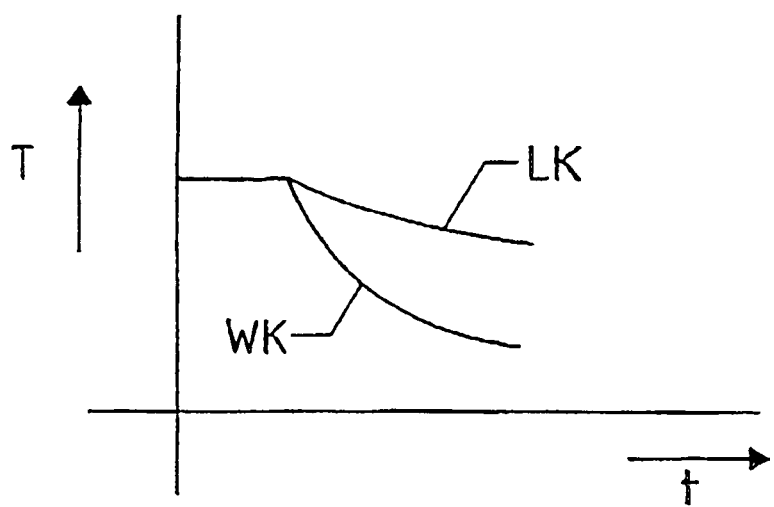

FIGS. 2 and 3 show conceptually the temperature/time curve of the module 1 and therefore also of the ceramic-metal substrate 2 forming the base of this module 1 during switching on or activation of the module (FIG. 2) and during switching off or deactivation of the module 1 (FIG. 3), for an air-cooled cooling element 11 (curve LK) and a liquid- or water-cooled cooling element 11 (curve WK), respectively.

As shown in FIG. 2, in an air-cooled cooling element 11 the temperature T rises to the operating temperature in the time t with a delay, while in a water-cooled cooling element 11, the temperature rise is relatively steep; the temperature gradient, i.e. the change of the temperature in the time t (temperature-time differential) is relatively abrupt. Analogously, the temperature curve during deactivation of the module 1, i.e. for an air-cooled cooling element 12, is such that the temperature T drops relatively slowly and constantly after deactivation, while in a liquid-cooled cooling element 11, the temperature change is very abrupt, i.e. also during deactivation, the temperature gradient (change of temperature T dependent on time t) is considerably greater than in an air-cooled cooling element 11, although the absolute cooling efficiency of a water-cooled cooling element 11, of course, is much higher.

Figure 4:
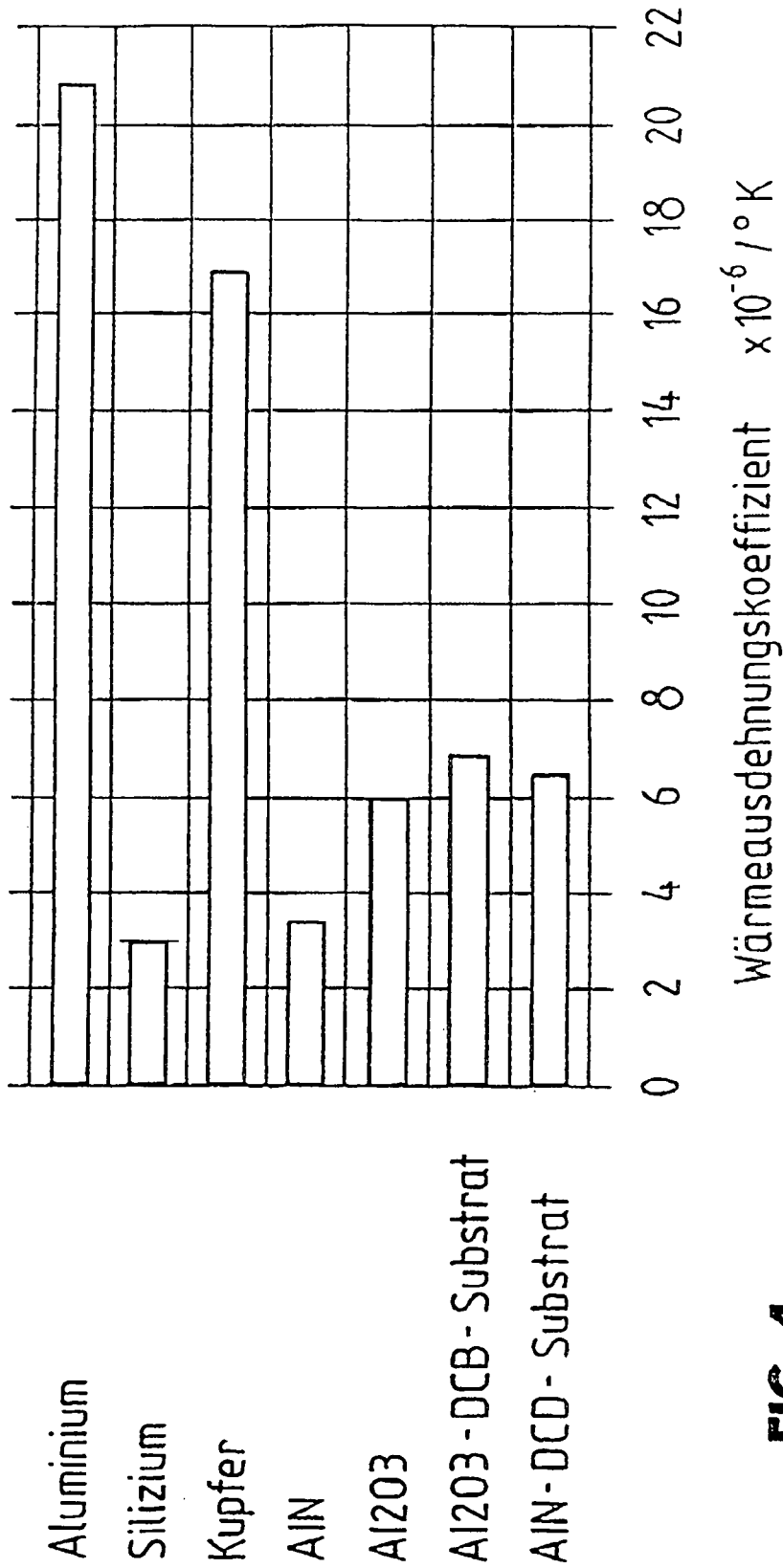
FIG. 4 is a graphical representation of the thermal expansion coefficient for various substrates.

FIG. 4 shows the thermal expansion coefficient, stated as $e \times 10^{-6}/°$ K, for various materials, namely for aluminum, silicon, copper, aluminum nitride ceramic (AlN), aluminum oxide ceramic ($Al_2O_3$), for DCB substrates with aluminum oxide ceramic ($Al_2O_3$-DCB substrates) and for DCB substrates with an aluminum nitride ceramic (AlN-DCB substrates). Since cooling elements corresponding to the cooling element 11 generally are made of metals with high thermal conductivity, i.e. copper and aluminum, the representation in FIG. 4 clearly shows that in the case of the modular construction or modular unit of FIG. 1, made up of the module 1 and the cooling element 11, the different thermal expansion coefficient e of the substrate 2 and the cooling element 11, which is made of copper, for example, is sufficient to cause tensions within the modular unit, which (tensions) essentially affect the solder layer 12, i.e. are absorbed and even partially compensated by the latter. To achieve an optimal cooling effect, the solder layer 12 is as thin as possible. The thickness of the solder layer is, for example, only 0 to 300 mμ.

If the module 1 is not operated continuously, but rather in switching mode or intermittently, as is generally the case with a module for controlling or switching drives, for example, the solder layer 12 is subjected to very strong, constantly changing mechanical tensions, which especially also in the case of a water- or liquid-cooled cooling element 11 cause a high shock load to the solder layer 12. This can destroy the solder bond between the module 1 and the cooling element 11 and, as a result of insufficient cooling, can also ultimately destroy the module 1.

The stress on the solder layer 12 due to the different thermal expansion coefficients of the adjoining ceramic-metal substrate 2 and of the cooling element 11 increases with the reduction of the thickness of the solder layer and is also dependent on the composition of the solder in the solder layer 12. The stress on the solder layer 12 is especially high if lead-free solder is used for this layer, which is increasingly being required to reduce environmental impact. Examples of such lead-free solders are SnAg5 and SnCu3.

Figure 5:
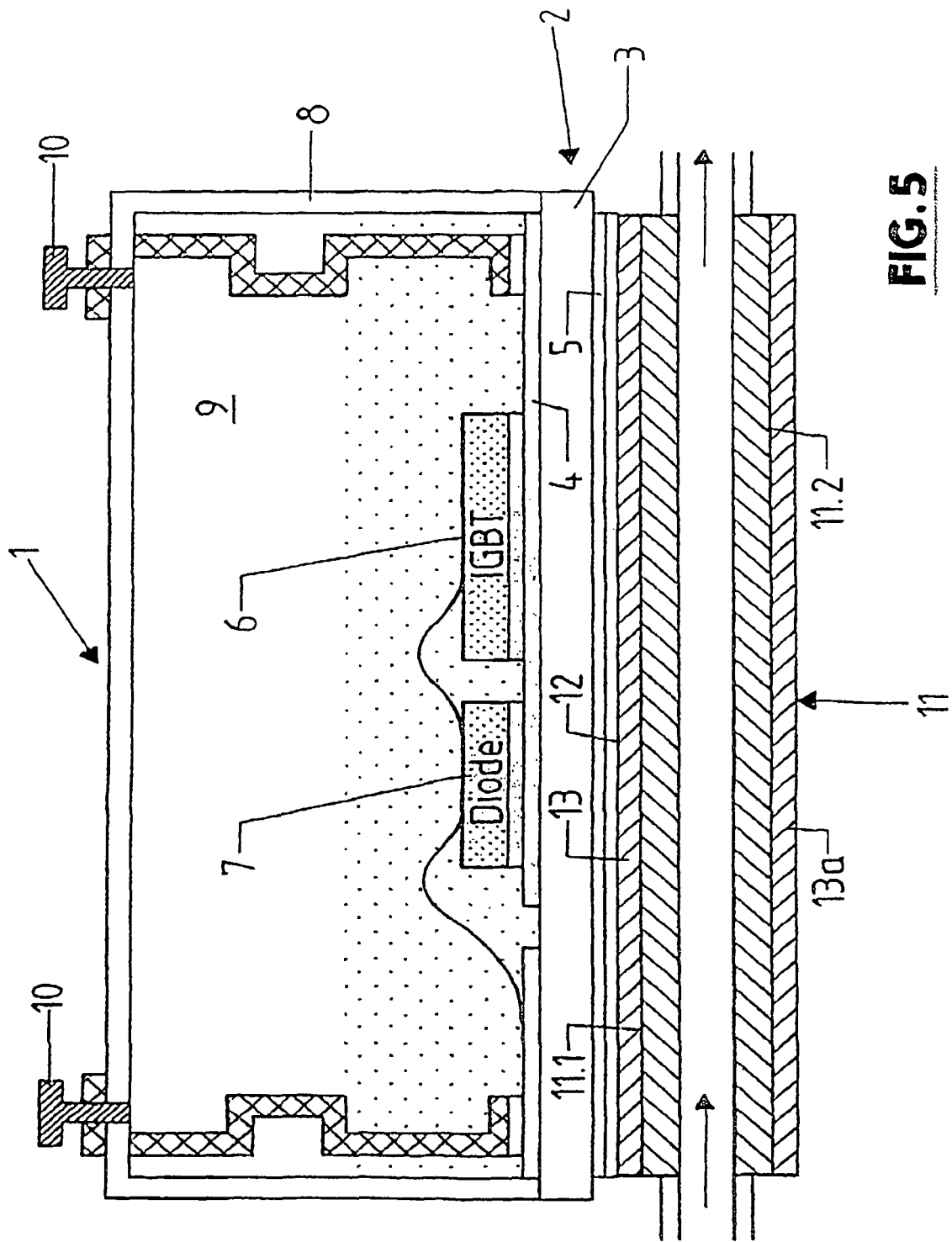
FIGS. 5-7 are schematic representations of further embodiments of the invention.

To prevent this disadvantage, as shown in FIG. 5, the cooling element 11 is provided on its top side 11.1 or cooling surface to be bonded with the substrate 1 with a compensating layer 13, which is made of a material with high thermal conductivity and a thermal expansion coefficient e that is lower than that of copper and aluminum, i.e. of a material with a thermal expansion coefficient e less than $10 \times 10^{-6}/°$ K. The compensating layer 13, which has a thermal conductivity greater than 100 W/m° K and the thickness of which is for example between 0.05 and 2 mm, is applied without any intermediate layer, i.e. directly to the cooling element 11 or to the metal (for example copper) of said cooling element 11 and is made for example of Mo, W, Mo—Cu, W—Cu, Cu-diamond and/or Cu—CNF (copper with carbon nanotubes or carbon nanofibers).

The intermediate or compensating layer 13 achieves equalization of the thermal expansion coefficients of the ceramic-metal substrate and the cooling element 11 in the area of the bond between these components, i.e. on both sides of the solder layer 11. Since the thermal expansion coefficient e of the ceramic-metal substrate 2 depends on the thickness of the ceramic layer 3, the thickness of the compensating layer 13 is also adapted to the thickness of the ceramic layer 3, preferably so the ratio of "thickness of the compensating layer 13/thickness of the ceramic layer 3" is between 1.3 and 0.25. In a preferred embodiment of the invention, the thickness of the compensating layer 13 is between 0.05 and 3 mm.

The application of the compensating layer 13 to the metal surface of the cooling element 11 is achieved with a suitable surface process, for example cladding, e.g. explosion cladding, by metal cold spraying, by thermal metal spraying, for example molten bath spraying, flame shock spraying, flame spraying, electric arc spraying, plasma spraying, etc.

The compensating layer 13 achieves equalization of the thermal expansion coefficients of the components provided on both sides of the solder layer 12 and therefore a reduction of the stress on the solder layer 12, especially in stop-and-go operation of the module 1 and also a reduction of the resulting constant temperature change of the module 1 and of the ceramic-metal substrate 2. This reduction is advantageous due to the high temperature gradient in the case of an active heat sink, i.e. a heat sink that comprises cooling channels within its cooling element 11 through which a gaseous and/or vaporous and/or liquid medium can flow and which is for optimal cooling, for example, so that the inner heat exchange or cooling surface that is in contact with the coolant is considerably larger, for example at least by a factor of 2 or 4, than the outer cooling surface that is in contact with the module 1.

To achieve a symmetrical design, especially also with respect to the temperature curve, the cooling element 11 is also provided on its bottom side facing away from the module 1 with an additional layer 13a corresponding to the compensating layer 13, the additional layer then having a thickness that is greater than the thickness of the compensating layer 13.

Figure 6:
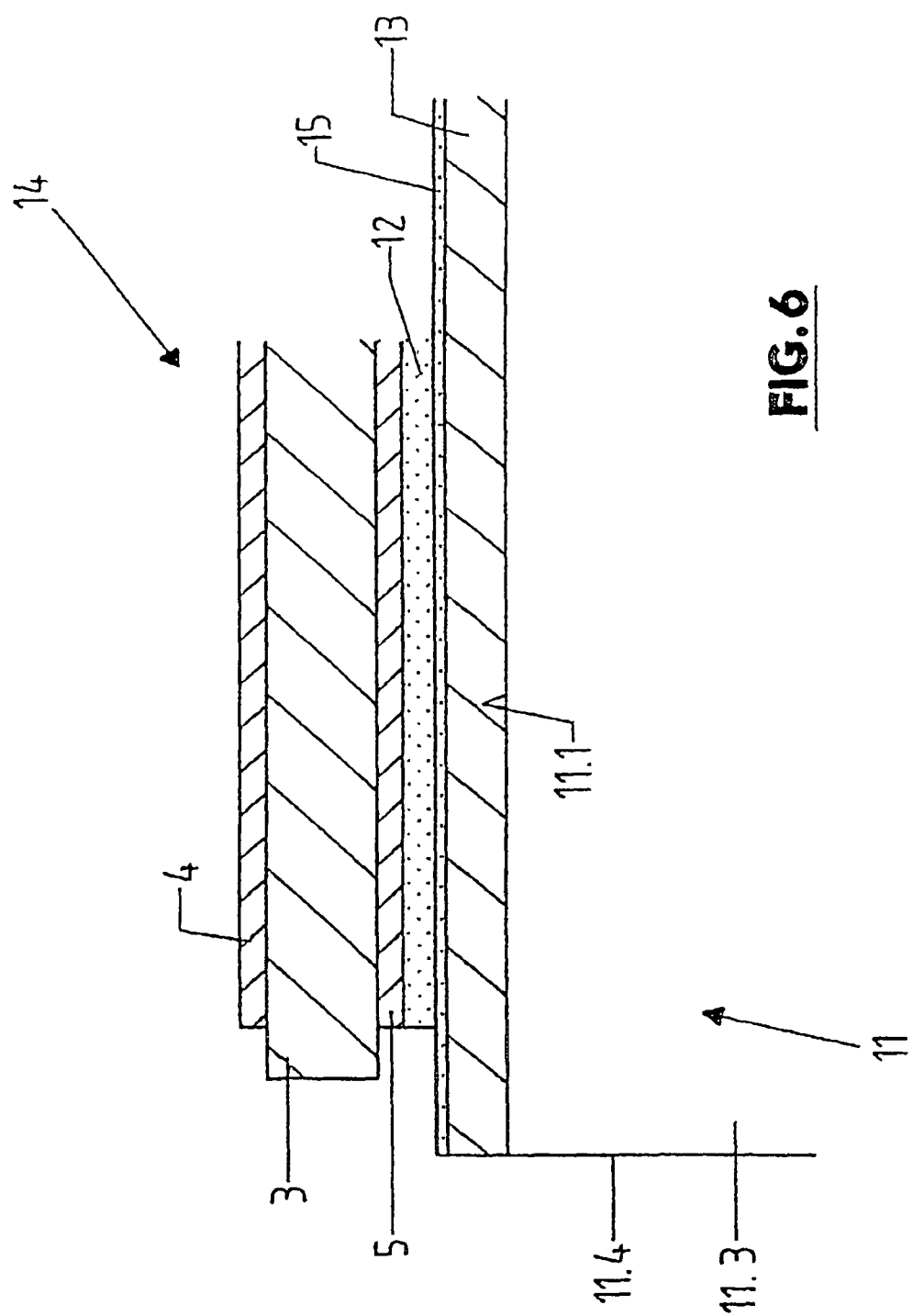

FIG. 6 shows in a simplified representation an arrangement 14, which is made up of the ceramic-metal substrate 2, which is part of a module not further depicted in this drawing, and of the cooling element 11 that is bonded with the ceramic-metal substrate 2 by means of a solder bond (solder layer 12), the cooling element 11 being made of copper at least on its top surface side that is bonded with the ceramic-metal substrate. The intermediate or compensating layer 13 is applied to the cooling element 11. In divergence from the embodiment in FIG. 5, the layer 13 is provided with a further intermediate layer 15 made of nickel or a nickel alloy, for example of a nickel-silver alloy or another alloy, which contains at least one metal that is also a component of the solder of the solder layer 12 adjoining the intermediate layer 15 and therefore bonding the cooling element 11 with the ceramic-metal substrate.

Figure 7:
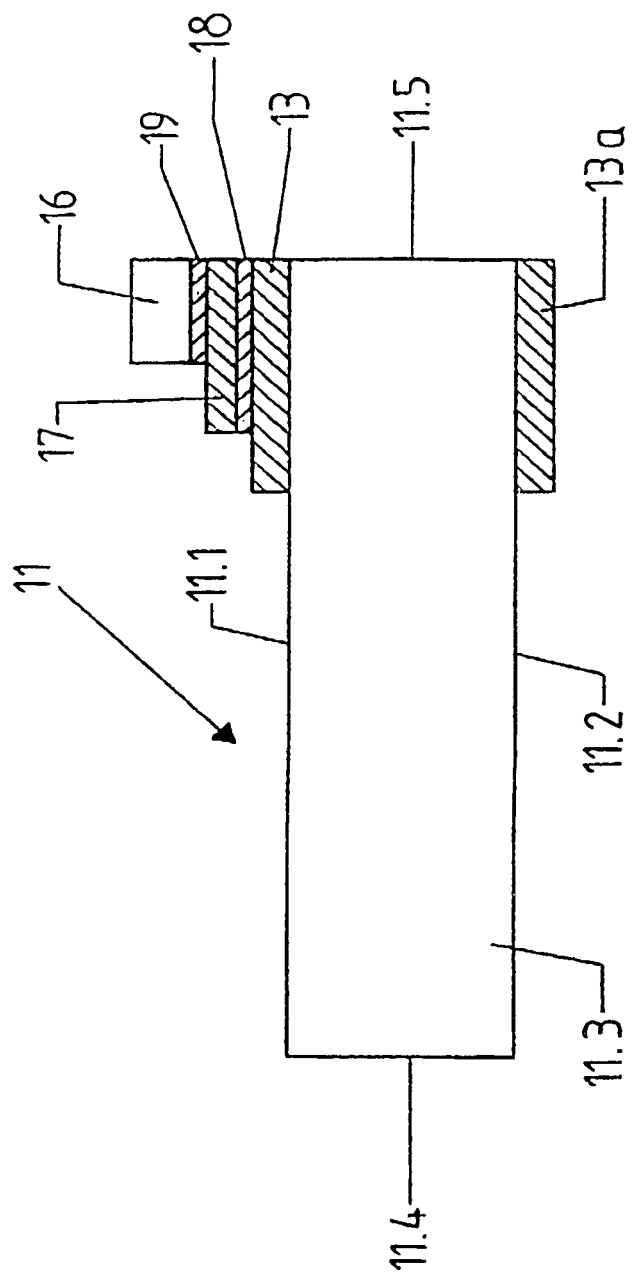

FIG. 7, in an enlarged partial representation, shows the cooling element 11 together with a laser bar 12, which is oriented with its longitudinal extension perpendicular to the plane of projection of FIG. 7 and comprises a plurality of laser light emitting emitters, which are provided offset from each other in the longitudinal direction of the laser bar. The cooling element 11 is again plate-shaped or cube-shaped, namely with the top side 11.1, the bottom side 11.2, the longitudinal sides 11.3 and the face sides 11.4 and 11.5 The laser bar 12 is provided on the top side 11.1 in the area of a face side 11.5, namely so that it is oriented with its longitudinal extension parallel to said face side and to the top side 11.1, i.e. it is oriented perpendicular to the plane of extension of FIG. 7 and lies with its laser light emitting side approximately flush with the face side 11.5.

At least in the area of the face side 11.5, a compensating layer 13 is applied to the top side 11.1 and the bottom side 11.2. The laser bar 16, which is provided with a plate-shaped intermediate carrier 17, is soldered onto the compensating layer 13 on the top side 11.1, namely by means of the solder layer 18 provided between the compensating layer 13 and the intermediate carrier 17 (submount). The bond between the laser bar 16 and the intermediate carrier 17 is formed by a solder layer 19, so that the laser bar lies with its laser light emitting side flush with a longitudinal side or longitudinal edge of the intermediate carrier 17 extending along the entire length of the laser bar 16, the intermediate carrier however projecting with its other longitudinal side over the back of the laser bar 16.

Due to the compensating layer 13, in this embodiment, equalization is achieved between the different thermal expansion coefficients of the cooling element 11 made of copper or aluminum and of the intermediate carrier 17 made of Cu—Mo and therefore reduction of the stress on the solder layer 18. To maintain a symmetrical design, with respect to the thermal aspects, the compensating layer 13 is provided with a corresponding layer 13a to the bottom side 11.2, namely so that the thickness of the layer 13a is greater than the thickness of the compensating layer 13, but less than the sum of the thicknesses of the compensating layer 13 and of the intermediate carrier 17.

The invention was described above based on exemplary embodiments. It goes without saying that numerous modifications and variations are possible without abandoning the underlying inventive idea upon which the invention is based.

For example, the compensating layer 13 and/or counter-layer 13a can also be made of sputtered ceramic or high-strength metals.

It is also possible to manufacture the compensating layer 13 and/or counter-layer 13a as composite layers, namely as single or multi-ply layers, in which case the single plies are made of several different materials, for example metals or alloys of different metals, or different plies of different materials or material mixtures (e.g. metal alloys), which then for example are applied using different processes. It is possible, for example, to apply a metal ply (e.g. Cu ply) by cold spraying and a further ply (e.g. ceramic ply) by plasma spraying.

Special layers or plies made of diamond, carbon and/or carbon nanofibers can be applied by chemical vapor deposition (CVD), in which case these layers or plies can then be coated with Cu powder cold gas.

The cooling element 11 can also be part of a heat pipe, in which case the layers 13 and/or 13a also serve to seal risk zones against leaking and for this reason alone already contribute to improving the service life of a constructional of modular unit.

REFERENCE LIST 1 module
2 ceramic-metal substrate, especially ceramic-copper substrate
3 ceramic layer
4, 5 metallization, for example copper layer
6, 7 electronic component
8 module housing
9 interior of housing
10 connection
11 cooling element or heat sink
11.1 top side
11.2 bottom side
11.3 longitudinal side
11.4, 11.5 face side
12 solder layer
13 compensating layer
13a additional layer
14 arrangement
15 intermediate layer
16 laser bar
17 subcarrier or submount
18, 19 solder layer

What is claimed is:
1. An assembly or module unit comprising:
an electric or electronic power module;
a ceramic-metal substrate, the ceramic-metal substrate consists of a ceramic layer and a metallization applied on each of the surface sides of the ceramic layer;
at least one metal heat sink comprising at least one cooling element, which forms at least one cooling surface for mounting of the ceramic-metal substrate thereto, wherein the at least one cooling element of the at least one metal heat sink is provided with at least one compensating layer comprising at least one single layer applied directly to the at least one cooling surface, wherein the at least one compensating layer comprises Mo, W, Mo—Cu, W—Cu, Cu—CNF, Cu-diamond, carbon, carbon-nanofibers or combinations thereof; and wherein the metalization on one surface side of the ceramic layer of the ceramic-metal substrate is fastened to the at least one compensating layer via a solder layer, wherein a thickness of the at least one compensating layer is between 0.05 mm and 20 mm, and wherein the compensating layer has a thermal expansion coefficient that is lower than $10 \times 10^{6}/^\circ K$ and a thermal conductivity greater than 100 W/m°K and the compensating layer achieves equalization of thermal expansion coefficients of the ceramic-metal substrate and the cooling element in an area of a bond between them.

2. The assembly or module unit according to claim 1, wherein the at least one cooling element, at least on a side opposite the at least one cooling surface, is provided with a further layer consisting of at least one single layer and corresponding to the at least one compensating layer.

3. The assembly or module unit according to claim 2, wherein the at least one compensating layer or the further layer is produced as a composite layer made of different materials of several single layers or plies, in which the single layers are applied at least partially by cold gas spraying.

4. The assembly or module unit according to claim 2, wherein the at least one compensating layer or the further layer or at least one single layer of the at least one compensating layer or of the further layer is applied to the cooling element or an existing ply of the at least one compensating layer or of the further layer by means of cladding, explosion cladding, cold spraying, metal powder cold gas coating, thermal spraying or sputtering.

5. The assembly or module unit according to claim 2, wherein the at least one compensating layer or the further layer or at least one single layer of the at least one compensating layer or of the further layer is applied to the at least one cooling element or an existing single layer of the at least one compensating layer or of the further layer by means of chemical vapor deposition.

6. The assembly or module unit according to claim 1, wherein the at least one cooling element is symmetrical or essentially symmetrical with respect to the layer or material sequence in relation to a plane extending parallel to the at least one cooling surface.

7. The assembly or module unit according to claim 1, wherein the at least one cooling element, at least in the area of the at least one cooling surface, is made of copper or aluminum.

8. The assembly or module unit according to claim 7, wherein the at least one cooling element is made of copper or aluminum throughout.

9. The assembly or module unit according to claim 7, wherein the at least one cooling element consists of several plates or layers bonded with each other, or several plates or layers bonded together by means of the DCB method.

10. The assembly or module unit according to claim 1, wherein at least one cooling channel is formed in the at least one cooling element through which a coolant can flow.

11. The assembly or module unit according to claim 10, wherein an inner cooling surface formed by the at least one cooling channel is larger than at least one outer cooling surface at least by a factor of 2, or by a factor of 4.

12. The assembly or module unit according to claim 1, wherein a further metal layer is applied to the at least one compensating layer.

13. The assembly or module unit according to claim 12, wherein the further metal layer contains at least one metal, which is part of a solder layer, by means of which an electric-component is connected with the at least one cooling element.

14. The assembly or module unit according to claim 2, wherein a metal single layer is applied by metal cold spraying in the case of at least two compensating layers.

15. The assembly or module unit according to claim 14, wherein the at least one compensating layer or the further layer consists of at least one plasma sprayed or sputtered ceramic layer and a cold gas sprayed metal layer, or a Cu layer.

16. The assembly or module unit according to claim 1, wherein the at least one compensating layer or the at least one further layer comprises a single layer made of CVD deposited diamond, carbon or carbon nanofibers and at least one metal layer, a Cu layer, formed by cold spraying or chemical deposition.

17. The assembly or module unit according to claim 1, wherein a maximum thickness of the solder layer is 300 m$\mu$.

18. The assembly or module unit according to claim 1, wherein the thickness of the solder layer is less than the thickness of the at least one-ply compensating layer.

19. The assembly or module unit according to claim 17, wherein the ceramic-metal substrate is a DCB substrate.

20. The assembly or module unit according to claim 1, wherein the ceramic layer is made of aluminum oxide or aluminum nitride ceramic.

21. The assembly or module unit according to claim 1, wherein the ceramic-metal substrate is manufactured using an active soldering process.

22. The assembly or module unit according to claim 1, wherein the at least one cooling element is provided on a surface side opposite the ceramic-metal substrate with a further at least one-ply layer corresponding to the at least one compensating layer, and that the further layer has a thickness that is greater than the thickness of the at least one compensating layer.

23. The assembly or module unit according to claim 1 wherein the ceramic-metal substrate is part of an electronic power circuit or the electric or electronic power module.

24. The assembly or module unit according to claim 1, wherein the at least one compensating layer is opposite a counter-layer corresponding to the at least one compensating layer and of a same material.

25. The assembly or module unit according to claim 24, wherein the thickness of the counter-layer is greater than the thickness of the at least one compensating layer.

26. The assembly or module unit according to claim 24, wherein a the thickness of the counter-layer is no more than the sum of the thickness of the at least one compensating layer and a thickness of the substrate.

27. The assembly or module unit according to claim 1, wherein the at least one compensating layer is produced as a composite layer made of different materials of several single layers, wherein the several single layers are applied at least partially by cold gas spraying.

28. The assembly or module unit according to claim 1, wherein the at least one compensating layer or at least one single layer of the at least one compensating layer is applied to the at least one cooling element or at least one single layer of the at least one compensating layer by means of chemical vapor deposition.

29. The assembly or module unit according to claim 1, wherein the at least one compensating layer or at least one single layer of the at least one compensating layer is applied to the cooling element or one of the at least one single layer of the compensating layer by means of cladding, explosion cladding, cold spraying, metal powder cold gas coating, thermal spraying or sputtering.

* * * * *